United States Patent
Moens et al.

(10) Patent No.: US 10,505,000 B2
(45) Date of Patent: Dec. 10, 2019

(54) ELECTRONIC DEVICE INCLUDING A TRANSISTOR STRUCTURE HAVING DIFFERENT SEMICONDUCTOR BASE MATERIALS

(71) Applicant: SEMICONDUCTOR COMPONENTS INDUSTRIES, LLC, Phoenix, AZ (US)

(72) Inventors: Peter Moens, Erwetegem (BE); Piet Vanmeerbeek, Sleidinge (BE); Gary H. Loechelt, Tempe, AZ (US); John Michael Parsey, Jr., Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 22 days.

(21) Appl. No.: 15/856,229

(22) Filed: Dec. 28, 2017

(65) Prior Publication Data
US 2019/0043958 A1   Feb. 7, 2019

Related U.S. Application Data

(60) Provisional application No. 62/540,336, filed on Aug. 2, 2017.

(51) Int. Cl.
*H01L 29/08* (2006.01)
*H01L 29/267* (2006.01)
(Continued)

(52) U.S. Cl.
CPC ........ *H01L 29/267* (2013.01); *H01L 21/0254* (2013.01); *H01L 21/02532* (2013.01);
(Continued)

(58) Field of Classification Search
CPC . H01L 26/267; H01L 29/267; H01L 29/0865; H01L 29/0886; H01L 29/0804; H01L 29/0821
See application file for complete search history.

(56) References Cited

U.S. PATENT DOCUMENTS 4,754,310 A   6/1988 Coe
4,886,356 A   12/1989 Paradis
(Continued)

OTHER PUBLICATIONS

Andre et al., "Impact of dislocation densities on n+/p and p+/n junction GaAs diodes and solar cells on SiGe virtual substrates", Journal of Applied Physics, 98 (1), dated Jul. 2005, pp. 014502-1-014502-5.
(Continued)

*Primary Examiner* — Douglas M Menz
(74) *Attorney, Agent, or Firm* — Abel Schillinger, LLP

(57) ABSTRACT

An electronic device can include a transistor structure. In an embodiment, the transistor structure can include a channel region and a drift structure including different semiconductor base materials. In another embodiment, the transistor structure can include a source region and a drain structure including a first region, wherein the source region and the first region include different semiconductor base materials and have the same conductivity type. In another aspect, a process of forming an electronic device can include forming a semiconductor layer; forming a body region; patterning the body region and the semiconductor layer to define a trench having a sidewall; forming a first region of a drain structure along the sidewall of the trench, wherein the first region and body region include different semiconductor base materials and different conductivity types.

20 Claims, 5 Drawing Sheets

(51) Int. Cl.
*H01L 29/739* (2006.01)
*H01L 29/10* (2006.01)
*H01L 29/36* (2006.01)
*H01L 29/423* (2006.01)
*H01L 29/06* (2006.01)
*H01L 21/02* (2006.01)
*H01L 29/66* (2006.01)
*H01L 29/78* (2006.01)

(52) U.S. Cl.
CPC .. *H01L 21/02543* (2013.01); *H01L 21/02546* (2013.01); *H01L 29/0634* (2013.01); *H01L 29/0804* (2013.01); *H01L 29/0821* (2013.01); *H01L 29/0865* (2013.01); *H01L 29/0886* (2013.01); *H01L 29/1004* (2013.01); *H01L 29/1033* (2013.01); *H01L 29/1095* (2013.01); *H01L 29/36* (2013.01); *H01L 29/4236* (2013.01); *H01L 29/66348* (2013.01); *H01L 29/66522* (2013.01); *H01L 29/66734* (2013.01); *H01L 29/7397* (2013.01); *H01L 29/7813* (2013.01)

(56) References Cited

U.S. PATENT DOCUMENTS

| | | | |
|---|---|---|---|
| 5,777,363 A * | 7/1998 | Malhi | E05B 47/00 |
| | | | 257/192 |
| 7,176,524 B2 | 2/2007 | Loechelt et al. | |
| 7,285,823 B2 | 10/2007 | Loechelt et al. | |
| 8,785,972 B2 | 7/2014 | Morishita | |
| 8,785,975 B2 | 7/2014 | Nie et al. | |
| 2008/0048175 A1 | 2/2008 | de Frésart | |
| 2010/0148255 A1 | 6/2010 | Fuernhammer et al. | |
| 2014/0103428 A1 | 4/2014 | Kim | |
| 2014/0227837 A1 | 8/2014 | Bobde et al. | |

OTHER PUBLICATIONS

Andre et al., "Impact of dislocations on minority carrier electron and hole lifetimes in GaAs grown on metamorphic SiGe substrates", Applied Physics Letters, 84 (18), dated May 3, 2004, pp. 3447-3449.

Andre et al., "Investigations of High-Performance GaAs Solar Cells Grown on Ge-Si1-xGex-Si Substrates", IEEE Transactions on Electron Devices, 52 (6), dated Jun. 2005, pp. 1055-1060.

Chang et al., "A GeSi-Buffer Structure for Growth of High-Quality GaAs Epitaxial Layers on a Si Substrate", Journal of Electronic Materials, 34 (1), dated 2005, pp. 23-26.

Matyi et al., "Substrate Orientation and Processing Effects on GaAs / Si Misorientation in GaAs-on-Si Grown by MBE", Journal of Electronic Materials, 17 (1), dated 1988, pp. 87-93.

Merckling et al., "Selective area growth of InP in shallow trench isolation on large scale Si(001) wafer using defect confinement technique", Journal of Applied Physics, 114, dated 2013, pp. 033708-1-033708-9.

Wang et al., "Direct MOCVD epitaxy of GaAsP on SiGe virtual substrate withour growth of SiGe", Journal of Crystal Growth, 441, dated 2016, pp. 78-83.

* cited by examiner

ELECTRONIC DEVICE INCLUDING A TRANSISTOR STRUCTURE HAVING DIFFERENT SEMICONDUCTOR BASE MATERIALS

CROSS REFERENCE TO RELATED APPLICATION

This application claims priority under 35 U.S.C. § 119(e) to U.S. Patent Application No. 62/540,336 entitled "Electronic Device Including a Transistor Structure Having Different Semiconductor Base Materials and a Process of Forming the Same," by Moens et al., filed Aug. 2, 2017, which is assigned to the current assignee hereof and incorporated herein by reference in its entirety.

FIELD OF THE DISCLOSURE

The present disclosure relates to electronic devices and processes of forming electronic devices, and more particularly to, electronic devices including a transistor structure having different semiconductor base materials and processes of forming the same.

RELATED ART

Different semiconductor materials can be used for transistor structures; however, for each transistor structure, the current-carrying portions of the transistor structure are typically made of the same semiconductor base material, such as Si. Each of the materials that is used for the channel and drift regions has problems that limit device performance, particularly for power transistors. For example, Si has relatively low drift mobility, SiC has a relatively low inversion layer mobility, and GaN has gate quality issues and is commonly implemented as a depletion-mode transistor. Further improvement for power transistors is desired.

BRIEF DESCRIPTION OF THE DRAWINGS

Embodiments are illustrated by way of example and are not limited in the accompanying figures.

Figure 1:
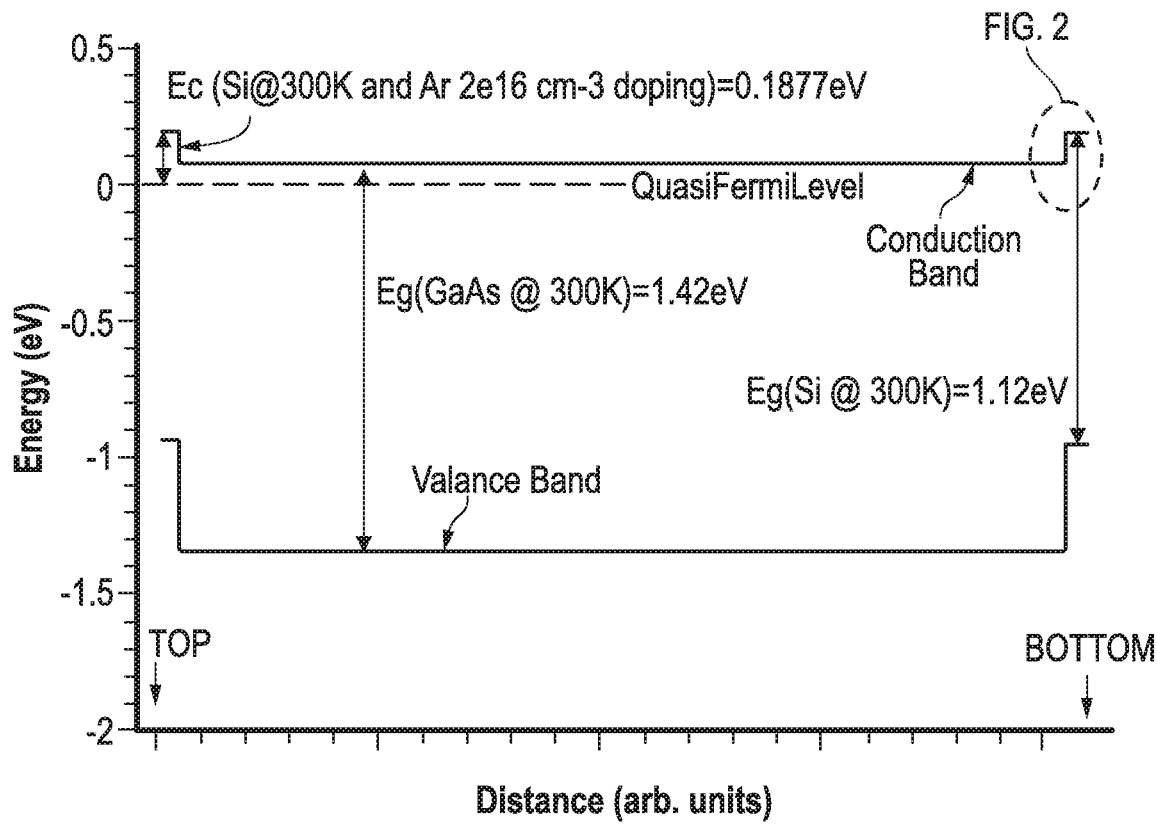
FIG. 1 includes a diagram illustrating conduction and valance bands at Si—GaAs junctions within a transistor structure in accordance with an embodiment described and illustrated herein FIG. 2 includes an enlarged portion of FIG. 1 to illustrate better the conduction band transition between GaAs and Si.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" intended to mean a semiconductor material that includes at least two different elements. Examples include SiC, SiGe, GaN, InP, $Al_xGa_{(1-x)}N$, $In_xAl_{(1-x)}N$ where $0 \leq x < 1$, $In_xAl_{(1-x-y)}Ga_yN$ where $0 \leq x < 1$ and $0 \leq y < 1$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element. A II-VI semiconductor material is intended to mean a semiconductor material that includes at least one divalent metal element and at least one Group 16 element.

The term "drift structure" intended to mean a portion of a transistor structure between the transistor structure's channel region or a base region and a relatively heavily doped portion of a drain region or a collector region. The drift structure has a relatively high resistivity as compared to the relatively heavily doped portion of the drain region or the collector region.

The term "power transistor" is intended to mean a transistor that is designed to normally operate with at least a 50 V difference maintained between the source and drain of the transistor or emitter and collector of the transistor when the transistor is in an off-state. For example, when the transistor is in an off-state, a 50 V may be maintained between the source and drain without a junction breakdown or other undesired condition occurring.

The term "semiconductor base material" refers to the principal material within a semiconductor substrate, region, or layer, and does not refer to any dopant within the semiconductor substrate, region, or layer. A boron-doped Si layer has Si as the semiconductor base material, and a C-doped GaN layer has GaN as the semiconductor base material.

As used herein, all energies associated with conduction bands, valence bands, and bandgaps are at 300 K unless explicitly stated otherwise. Further, carrier mobilities are at 300 K unless explicitly stated otherwise.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Different semiconductor base materials within a transistor structure can be used to provide unusually good transistor performance. For example, a transistor structure may have a source region or a channel region that includes a semiconductor base material, and a drift structure that includes another semiconductor base material to provide improved device performance. In an aspect, the semiconductor base material for the source and channel regions of the transistor can be used with a gate structure to provide good on-state and off-state device characteristics, and the other semiconductor base material for the drift structure can help to increase carrier mobility as compared to the semiconductor base material used for the source and channel regions. The higher carrier mobility provides for lower on-state resistance.

The selection of semiconductor base materials may depend on the particular application. When charge carriers are electrons, the different semiconductor base materials can have conduction bands at energies that are relatively close to each other. For example, the conduction bands for the different semiconductor base materials may be within 0.2 eV of each other. When the charge carriers are holes, the different semiconductor base materials can have valence bands at energies that are relatively close to each other. For example, the valence bands for the different semiconductor base materials may be within 0.2 eV of each other.

In a particular embodiment, the charge carriers are electrons, Si is the semiconductor base material for the source and channel regions, and GaAs is the semiconductor base material used in the drift structure. The conduction bands for Si and GaAs are 0.11 eV apart from each other. Other semiconductor base materials may be selected for different applications, and therefore, the scope of the present disclosure is not limited to Si and GaAs for semiconductor base materials.

In another embodiment, a superjunction structure can be used to allow good on-state resistance and still provide good drain-to-source breakdown voltage. In a particular embodiment, a drift layer of the drift structure can have a different semiconductor base material as compared to a compensation layer within the superjunction structure to allow the drift layer to be strained.

A power transistor structure can be designed where the source region, the channel region, and the heavily doped portion of the drain region include Si as the semiconductor base material. The drift structure can include a compound semiconductor as the semiconductor base material. Thus, the transistor structure will have one transition between Si and the compound semiconductor near the channel region, and another transistor between the compound semiconductor and Si near the heavily doped portion of the drain region. The transition between the energy levels of the conduction bands is more significant when the energy level increases at the transition, as compared to the energy level decreasing at the transition.

Figure 2:
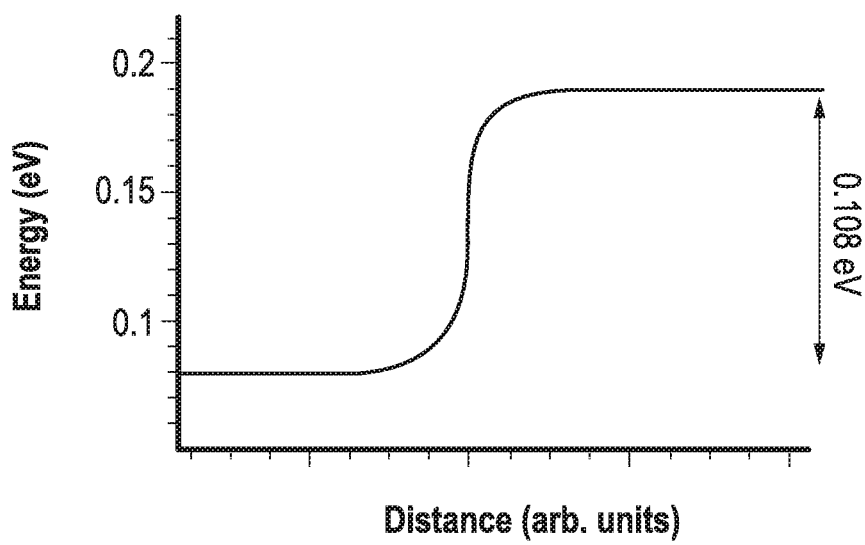

FIG. 1 includes a plot of the energies of the conduction and valance bands as a function of distance from the source region to the heavily doped of the drain region when the source region and heavily doped portion of drain region of the transistor structure are at 0 V. The semiconductor base material for the source and channel regions is Si and has a bandgap energy of 1.12 eV. A semiconductor base material in the drift structure includes GaAs and has a bandgap energy of 1.42 eV. The energy levels of both the conduction and valance bands decrease when transitioning from Si to GaAs. Thus, electrons can freely flow from the Si to the GaAs. The semiconductor base material for the heavily doped portion of the drain region is Si, and the energy levels of both the conduction and valance bands increase when transitioning from GaAs to Si. Because the energy level increases, the electrons can flow from the Si to the GaAs if the electrons have sufficient energy. FIG. 2 includes a portion of the plot in FIG. 1 to illustrate better the transition from GaAs to Si. The difference in energy between the conduction bands of GaAs and Si is less than 0.20 eV, and more particularly is 0.11 eV. The difference in energy also depends on the doping concentrations in the GaAs and Si layers. A heavily n-type doped Si substrate is beneficial for lowering the energy difference between the GaAs and Si as well as the substrate resistance. If the carriers would be holes, the energy difference between the valance bands is approximately 0.41 eV. The selection of Si and GaAs is good when the carriers are electrons, but not as good when the carriers are holes.

Although many details have been described with respect to Si and GaAs, other pairs of may be used. For example, in another transistor structure, other electrical properties may be significant, and the selection of semiconductor base materials can be tailored for such electrical properties.

Figure 3:
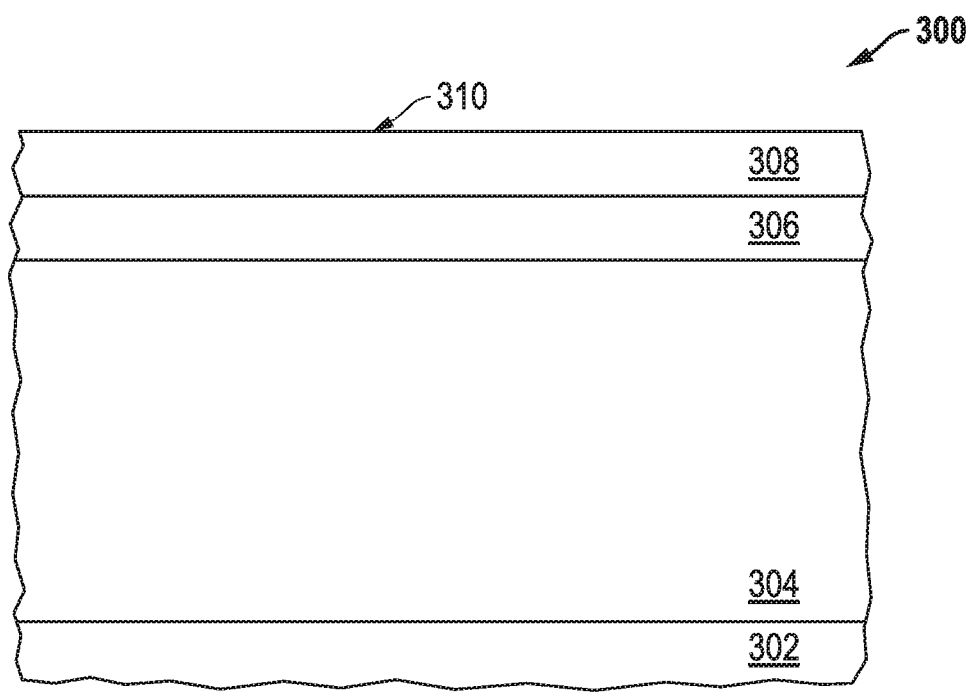
FIG. 3 includes an illustration of a portion of a workpiece including a buried doped region, a semiconductor layer, a lower doped region, and a body region.
Figure 4:
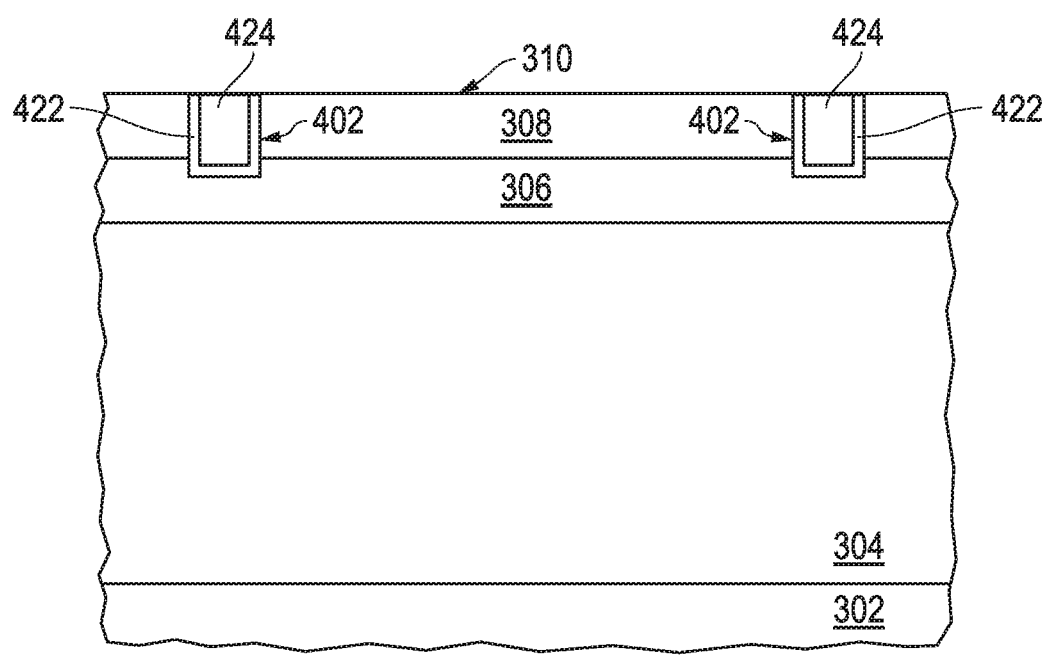
FIG. 4 includes an illustration of the workpiece of FIG. 3 after forming gate structures.

FIG. 3 includes an illustration of a cross-sectional view of a portion of a workpiece 300 a substrate region or buried doped region 302, a monocrystalline semiconductor layer 304, a lower doped region 306, and an upper doped region, which is referred to herein as a body region 308. The buried doped region 302 can be a heavily doped semiconductor substrate or may be a portion of semiconductor substrate that is heavily doped. The buried doped region 302 can have a dopant concentration of at least $1 \times 10^{19}$ atoms/cm$^3$. In a particular embodiment, the buried doped region 302 includes Si as the semiconductor base material and is n-type doped.

The monocrystalline semiconductor layer 304 can be formed by epitaxially growing a semiconductor layer from the buried doped region 302. The semiconductor base material of the monocrystalline semiconductor layer 304 can be the same as the buried doped region 302. The thickness and doping of the monocrystalline semiconductor layer 304 can depend at least in part on the nominal operating voltage of the transistor structure. For a nominal operating voltage of 100 V, the monocrystalline semiconductor layer 304 may be relatively thinner and have a relatively higher dopant concentration as compared to the monocrystalline semiconductor layer 304 when the nominal operating voltage is at least 400 V. In a particular embodiment, the monocrystalline semiconductor layer 304 has a thickness in a range of 4 microns to 90 microns and is undoped. As used herein, undoped or an intrinsic semiconductor layer or region has a dopant concentration of at most $5 \times 10^{13}$ atoms/cm$^3$.

The lower doped region 306 will be part of a drift structure for the transistor structure being formed and helps charge carriers to migrate from the channel region of the transistor structure to another portion of the drift structure that includes a different semiconductor base material as compared to the channel region. The lower doped region 306 has the same semiconductor base material, the same conductivity type, and a significantly lower dopant concentration as compared to buried doped region 302. In a particular embodiment, the lower doped region 306 is n-type doped. The peak dopant concentration of the lower doped region 306 can be in a range of $1 \times 10^{16}$ atoms/cm$^3$ to $1 \times 10^{17}$ atoms/cm$^3$. The lower doped region 306 can have a thickness in a range of 0.2 micron to 2.0 microns or in a range of 0.2% to 9.0% of the thickness of the monocrystalline semiconductor layer 304 in the finished device. The lower doped region 306 may be formed by using a dopant gas (e.g., PH$_3$ or AsH$_3$) during an epitaxial growth after forming the monocrystalline semiconductor layer 304 or may be formed by ion implantation of P$^+$, As$^+$, or Sb$^+$ ions into the monocrystalline semiconductor layer 304.

The body region 308 can have a thickness that in part determines the channel length of the transistor structure being formed. In an embodiment, the body region 308 has a thickness in a range of 0.05 micron to 2.0 microns. The body region 308 has a conductivity opposite that of the buried and lower doped regions 302 and 306. The body region 308 can include the same semiconductor base material as the lower doped region 306. The peak dopant concentration of the body region 308 can be in a range of $5 \times 10^{14}$ atoms/cm$^3$ to $1 \times 10^{18}$ atoms/cm$^3$. The body region 308 can be doped during the epitaxial growth or may be doped after the epitaxial growth. The primary surface 310 provides a reference plane when describing depths of openings and trenches as described later in this specification. If the lower doped and body regions 306 and 308 are formed by ion implantation, the primary surface 310 corresponds to the surface of the monocrystalline semiconductor layer 304 as formed and before doping to form the lower and body doped regions 306 and 308.

The workpiece can be patterned to define gate openings 402 for gate structures. The gate openings extend from the primary surface 310 through the body region 308 and into the lower doped region 306. A gate dielectric layer 422 and a conductive layer are formed over the primary surface and within the gate openings 402. The gate dielectric layer 422 can include an oxide or an oxynitride. The thickness of the gate dielectric layer 422 can depend on the nominal operating voltage of the transistor structure. In an embodiment, the thickness is in a range of 20 nm to 100 nm. The gate dielectric layer 422 can be thermally grown from the exposed portions of the lower doped and body regions 306 and 308, can be deposited, or a combination thereof. The conductive layer can be deposited over the gate dielectric layer 422 and fill remaining portions of the gate openings 402. The conductive layer can include a material commonly used in forming a gate electrode and, in a particular embodiment, includes heavily doped polysilicon. Portions of the conductive layer overlying the primary surface are removed leaving the gate electrodes 424 within the gate openings 402.

Figure 5:
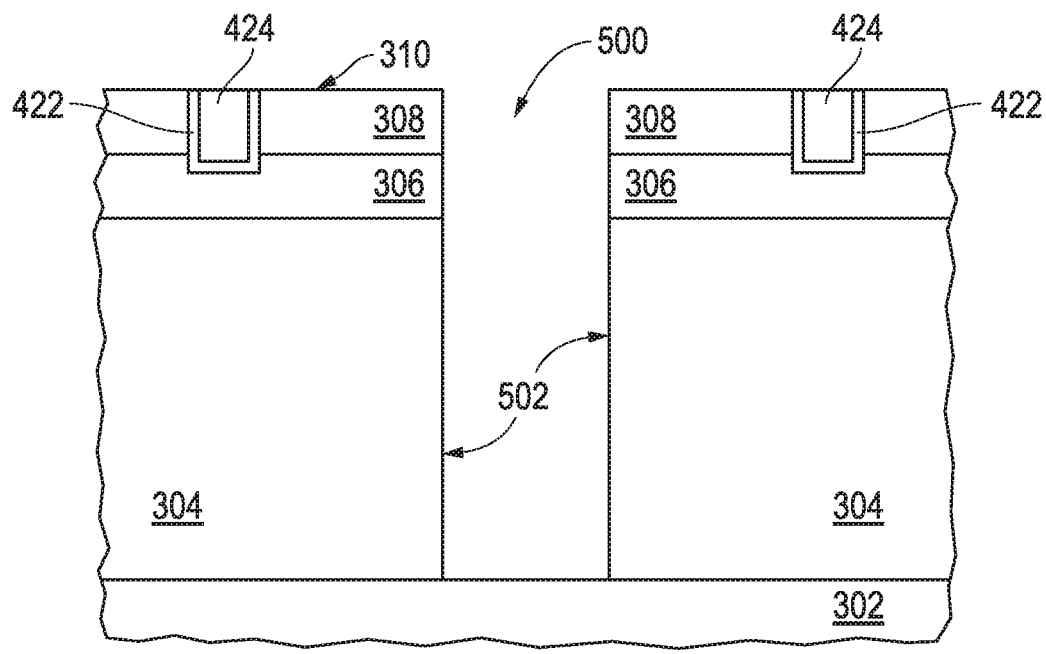
FIG. 5 includes illustrations of the workpiece of FIG. 4 after patterning the body region, lower doped region, and semiconductor layer to define a trench.

FIG. 5 includes a cross-sectional view of the workpiece after defining a trench 500 having sidewalls 502. A portion of the drift structure and a superjunction structure will be subsequently formed within the trench 500. The trench 500 extends from the primary surface 310 toward the buried doped region 302. In an embodiment, the trench 500 extends completely through the body region 308 and the lower doped region 306 and through at least a majority of the thickness of the monocrystalline semiconductor layer 304. In a particular embodiment, the trench 500 extends to the buried doped region 302. In another particular embodiment, the trench 500 does not extend to the buried doped region 302; however dopant of the same conductivity type as the buried doped region 302 may be introduced along the bottom of the trench 500, so that dopant extends from the buried doped region 302 to the bottom of the trench 500. The trench 500 can be formed by anisotropically etching the body region 308, lower doped region 306, and the monocrystalline semiconductor layer 304. The etch may be performed as a timed etch or using endpoint detection with or without a timed overetch. The trench 500 may be tapered if needed or desired for a particular application.

Figure 6:
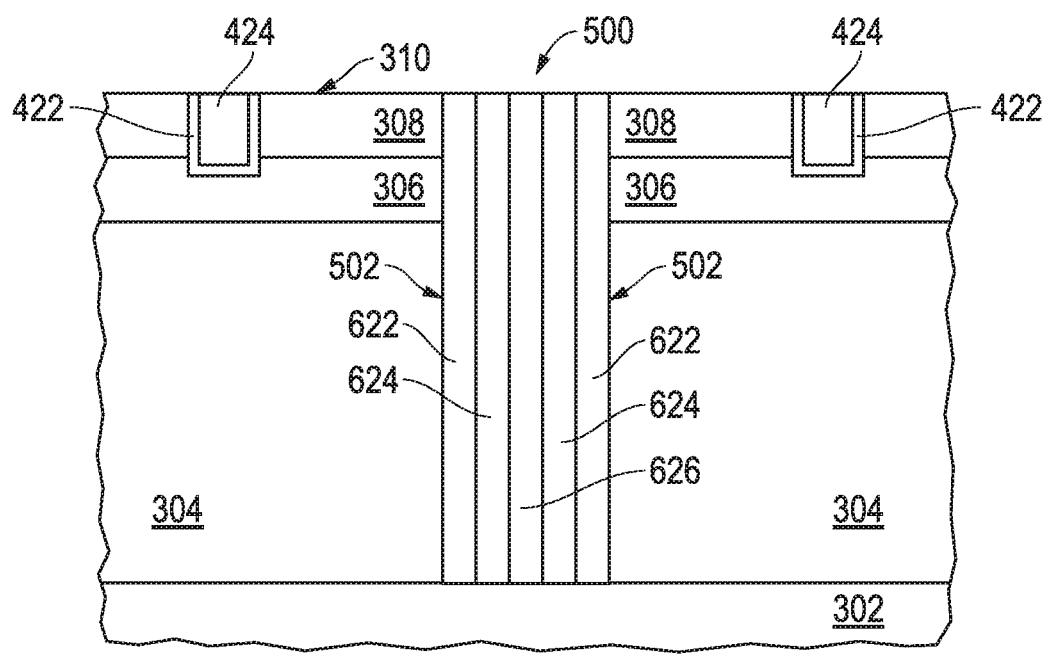
FIG. 6 includes an illustration of the workpiece of FIG. 5 after forming a drift layer, a compensation layer, and an insulator within the trench.

FIG. 6 includes the workpiece after forming a drift layer 622, a compensation layer 624, and an insulator 626. The drift layer 622 provides a primary, vertical, low-resistance current path from the lower doped region 306 to the buried doped region 302 when transistor structure is in an on state. When transistor structure is an off state, the drift layer 622 and compensation layer 624 compensate each other to form a superjunction structure and provide improved drain-to-source breakdown voltage. Additional n-type and p-type layers may be used if needed or desired.

Referring to FIG. 6, a drift layer 622 is part of the drift structure for the transistor structures and is along the sidewalls 502 of the trench 500. The lower doped region 306 makes up the remaining portion of the drift structure. The drift layer 622 includes a semiconductor base material that is different from the semiconductor base material of any one or more of the buried doped region 302, the monocrystalline semiconductor layer 304, the lower doped region 306, or the body region 308. In a particular embodiment, an n-channel transistor is being formed, and therefore, the selection of the semiconductor base material for the drift layer 622 has an energy of its conduction band relatively close to the conduction band of the semiconductor base material of the buried doped region 302, the monocrystalline semiconductor layer 304, the lower doped region 306, the body region 308, or any combination thereof. The carrier mobility of the drift layer 622 is greater than 1410 cm$^2$/V~s, and even greater than 6000 cm$^2$/V~s. When the semiconductor base material for the drift layer 622 is GaAs, the electron mobility is approximately 8500 cm$^2$/V·s.

In a particular embodiment, the semiconductor base material for the buried doped region 302, the monocrystalline semiconductor layer 304, the lower doped region 306, and the body region 308 is Si, and the semiconductor base material for the drift layer 622 is GaAs. The drift layer 622 has the same conductivity type as the buried doped region 302 and the lower doped region 306, and the opposite conductivity type as compared to the body region 308. When the charge carriers are electrons, the drift layer 622 is n-type doped. The average dopant concentration of the drift layer 622 is selected to reduce the electric field near the gate electrodes 424 and subsequently-formed source region and still provide sufficiently low on-state resistance. In an embodiment, the average dopant concentration is in a range of $1 \times 10^{15}$ atoms/cm$^3$ to $1 \times 10^{17}$ atoms/cm$^3$. The thickness of the drift layer 622 is in a range of 0.2 micron to 0.7 micron.

The drift layer 622 is epitaxially grown from the exposed material within the trench 500. In an embodiment, the drift layer 622 can be formed using chemical vapor deposition (CVD), and in a particular embodiment is metalorganic CVD. The pressure during deposition is selected so that the mean free path of gas molecules is at least the same as the depth of the trench 500. In an embodiment, the pressure can be in a range of 1 millitorr to 500 millitorr. In a particular embodiment, the pressure is at most 100 millitorr. The deposition temperature can be in a range of 450° C. to 750° C.

The drift layer 622 can include a III-V semiconductor material, such as GaAs, $Al_xGa_{(1-x)}N$ where $0 \leq x < 1$, $In_xAl_{(1-x)}N$ where $0 \leq x < 1$, $In_xAl_{(1-x-y)}Ga_yN$ where $0 \leq x < 1$ and $0 \leq y < 1$, InP, InSb, or any mixture thereof. The drift layer can be formed from a reaction between a Group 13 source gas and a Group 15 source gas. The Group 13 source gas can include trimethyl gallium (Ga(CH$_3$)$_3$), triethyl gallium (Ga(CH$_2$CH$_3$)$_3$), trimethyl indium (In(CH$_3$)$_3$), triethyl indium (In(CH$_2$CH$_3$)$_3$), or the like, trimethyl aluminum (Al(CH$_3$)$_3$), triethyl aluminum (Al(CH$_2$CH$_3$)$_3$), or the like. The Group 15 gas can include trimethylarsine ((CH$_3$)$_3$As), tertiarybutylarsine ((CH$_3$)$_3$CAsH$_2$), phosphine (PH$_3$), trimethyl phosphine (P(CH$_3$)$_3$), ammonium (NH$_3$), hydrazine (N$_2$H$_4$), stibine (SbH$_3$), trimethyl stibine (Sb(CH$_3$)$_3$) or the like.

The gas flow ratio of the Group 13 (e.g., Ga, In, Al) source gas to the Group 15 (e.g., As, P, N, Sb) source gas is in a range of 0.2 to 1.5. In an embodiment, the ratio is at most 0.95 to avoid forming a layer having an excess of metal. A diluent gas, such as H$_2$ or HCl may be added. When depositing, the Group 13 source gas may be turned on before the Group 15 source gas is turned on, and the Group 13 source gas may be turned off before the Group 15 source gas is turned off.

In another embodiment, a first portion of the drift layer 622 can be formed using atomic layer deposition (ALD). The ALD layer will serve as a seed layer for subsequent growth of layer 622. The thickness of the seed layer can be between 0.5 nm and 20 nm. The seed layer is undoped. Typical source gasses are GaCl$_3$ and AsH$_3$. Growth can be selective and non-selective. In an embodiment, the first portion is undoped and has a thickness in a range of 1 nm to 20 nm. This first portion can help with replicating the crystal lattice into a remaining portion of the drift layer 622. The remaining portion of the drift layer 622 can be formed using a CVD process as previously described. The CVD process is performed until the desired thickness of the drift layer 622 is achieved.

The drift layer 622 can be doped in-situ when forming the remaining portion of the drift layer, where C substitutes for some of the Ga and acts as an n-type dopant. In another embodiment, a dopant gas, such as disilane (Si$_2$H$_6$), dimethyl selenium (Se(CH$_3$)$_2$), diethyl selenium (Se(CH$_2$CH$_3$)$_2$) dimethyl tellurium (Te(CH$_3$)$_2$), diethyl tellurium (Te(CH$_2$CH$_3$)$_2$), or the like can be used. Alternatively, the drift layer 622 can be ion implanted with Si, Ge, O, Se, Te, or the like. In one embodiment, Si$^+$ ions are implanted to a total dose in a range of $1.0 \times 10^{13}$ ions/cm$^2$ to $4.0 \times 10^{13}$ ions/cm$^2$ at an energy in a range of 10 to 100 keV with a tilt angle to allow the dopant to implanted to the proper depth within the trench 500. In a particular embodiment, the total dose can be introduced as four implants at ¼ of the total dose with a 90° rotation of the workpiece between the implants. Because of the small angle between the ion implant and the trench sidewall, the ion implant along the sidewall would be equivalent to an ion implant perpendicular to the surface with an effective dose in the drift layer 622 along the sidewalls 502 of the trench 500 in a range of $3.0 \times 10^{12}$ ions/cm$^2$ to $7.0 \times 10^{12}$ ions/cm$^2$. For other ions, the energy may be adjusted to achieve substantially the same projected range as for Sit and all other parameters would be the same as described for Si$^+$ ions. In subsequent thermal diffusion steps, the dopant will diffuse into the first portion of the drift layer 622.

The compensation layer 624 includes a doped semiconductor layer having an opposite conductivity type as compared to the drift layer 622. The dopant concentration of the compensation layer 624 is selected so that the charge of the drift and compensation layers 622 and 624 are relatively balanced. In an embodiment, charge can be integrated over the width of a cell at a location through the monocrystalline semiconductor layer 304 and midway between the buried doped region 302 and the lower doped region 306. In an embodiment in which the monocrystalline semiconductor layer 304 is undoped, the n-type charge is a product of the dopant concentration of the drift layer 622 times the cell width, and the p-type charge is a product of the dopant concentration of the compensation layer 624 times the cell width. Ideally, the difference between the n-type charge and the p-type charge is zero ($|Q_{n-type}|-|Q_{p-type}|=0$). In practice, the difference can be non-zero and may be no greater than $1 \times 10^{12}$/cm$^2$. If the monocrystalline semiconductor layer 304 would include a dopant, the doping concentration of the compensation layer 624 may be adjusted to keep the charge relatively balanced.

The compensation layer 624 is monocrystalline and epitaxially grown from the drift layer 622. In an embodiment where the monocrystalline semiconductor layer 304 is undoped, the compensation layer 624 can have any of the average dopant concentrations and thickness as described with respect to the drift layer 622, provided that the difference in charge, as previously described, is met.

The compensation layer 624 can include the same or different semiconductor base material as the drift layer 622. When the compensation layer 624 has the same semiconductor base material as the drift layer 622, the compensation layer 624 can be deposited using MOCVD. When the compensation layer 624 includes GaAs, the compensation layer 624 can be deposited as previously described. However, the growth conditions may be performed at a lower pressure to ensure less C from the Ga source gas is incorporated into the compensation layer 624. Alternatively, the compensation layer 624 can have a semiconductor base material that is Si. The silicon can reduce the depletion gap within the drift layer 622 adjacent to the compensation layer 624 due to the difference in energies between the valence bands of Si and GaAs. Furthermore, the drift layer 622 can be strained when the compensation layer 624 has Si as the semiconductor base material, further helping with carrier mobility. In an embodiment, a first portion of the compensation layer 624 may be grown using ALD or CVD at a relatively slower rate to help with replicating the crystal lattice into a remaining portion of the compensation layer 624. The remaining portion of the compensation layer 624 may be performed at a relatively higher rate.

The compensation layer 624 can be doped in-situ when forming the compensation layer 624 or doped using ion implantation. When the compensation layer 624 includes a Group 14 element (e.g., Si or Ge), a zinc-source gas (e.g., dimethyl zinc ($Zn(CH_3)_2$) or diethyl zinc ($Zn(CH_2CH_3)_2$) can be used during deposition, or the compensation layer 624 can be ion implanted with ions of $Zn^+$, $Mg^+$, or the like. When the compensation layer 624 includes a Group 14 element (e.g., Si or Ge), a boron-source gas can be used during deposition, or the compensation layer 624 can be ion implanted with ions of $B^+$ or $BF_2^+$, or the like. In one embodiment, $B^+$ ions are implanted to a total dose in a range of $1.0\times10^{13}$ ions/cm$^2$ to $4.0\times10^{13}$ ions/cm$^2$ at an energy in a range of 25 to 40 keV with a tilt angle to allow the dopant to implanted to the proper depth within the trench 500. In a particular embodiment, the total dose can be introduced as four implants at ¼ of the total dose with a 90° rotation of the workpiece between the implants. Because of the small angle between the ion implant and the trench sidewall, the ion implant along the sidewall would be equivalent to an ion implant perpendicular to the surface with an effective dose in the compensation layer 624 along the sidewalls 502 of the trench 500 in a range of $3.0\times10^{12}$ ions/cm$^2$ to $7.0\times10^{12}$ ions/cm$^2$ ions/cm$^2$. For other ions or when implanting into GaAs, the energy may be adjusted to achieve substantially the same projected range as for $B^+$ in silicon, and all other parameters would be the same as described for $B^+$ ions. If needed or desired, an undoped semiconductor layer may be further grown from the compensation layer 624.

The drift and compensation layers 622 and 624 can be etched to provide the structure as illustrated in FIG. 6. Alternatively, one or both of the layers 622 and 624 may remain along the bottom of the trench 500. For either embodiment, layers 622 and 624 are not grown over the primary surface 310, or if portions of the layers 622 and 624 are grown over the primary surface, such portions are removed.

An insulator 626 is formed within a remaining part of the trench 500. A trench fill material is deposited and can completely fill the trench 500 or deposited to seal off the trench 500 and form a void within the trench 500. In an embodiment, the trench fill material can be an insulator and include an oxide, a nitride, or an oxynitride, and may include a single film or a plurality of films. A planarization operation is performed to remove the trench fill material outside the trench 500.

Figure 7:
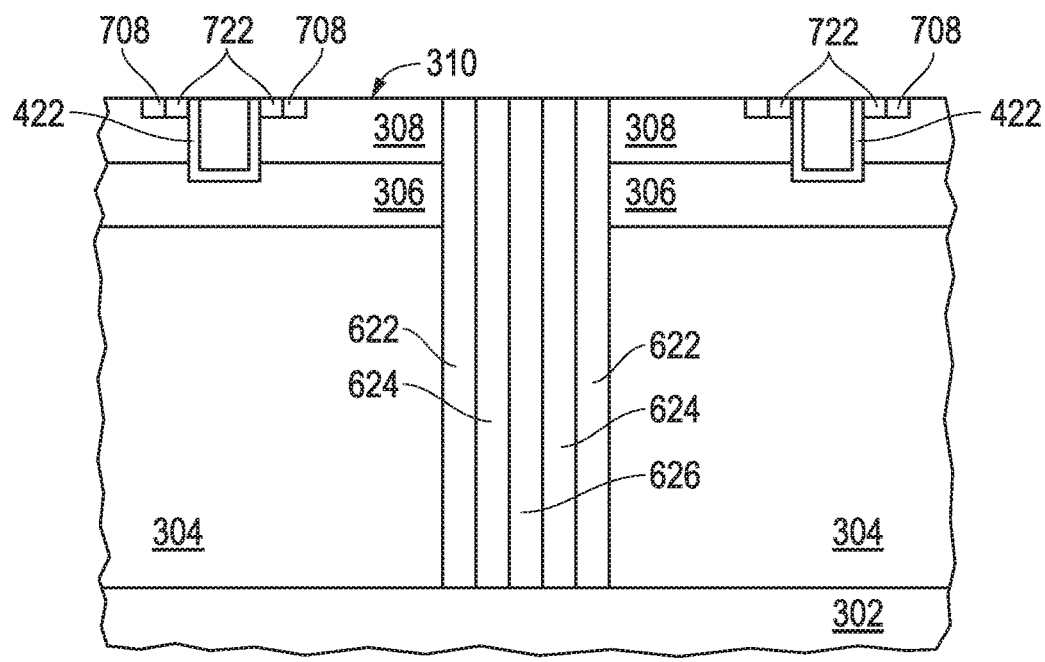
FIG. 7 includes an illustration of the workpiece of FIG. 6 after body contact and source regions.

FIG. 7 includes a cross-sectional view of the workpiece after forming body contact regions 708 and source regions 722. The body contact regions 708 allow ohmic contacts to be formed for the body region 308. In an embodiment, the body contact regions 708 can be formed by ion implantation with $B^+$ or $BF_2^+$ ions. The source regions 722 have the same conductivity type as the lower doped region 306, the drift layer 622, and the buried doped region 302 and the opposite conductivity type as compared to the body region 308. In an embodiment, source regions 722 can be formed by ion implantation with $As^+$ or $P^+$ ions. Each of the body contact regions 708 and the source regions 722 has a peak dopant concentration of at least $1\times10^{19}$ atoms/cm$^3$ and has a depth in a range of 0.05 micron to 0.5 micron.

Figure 8:
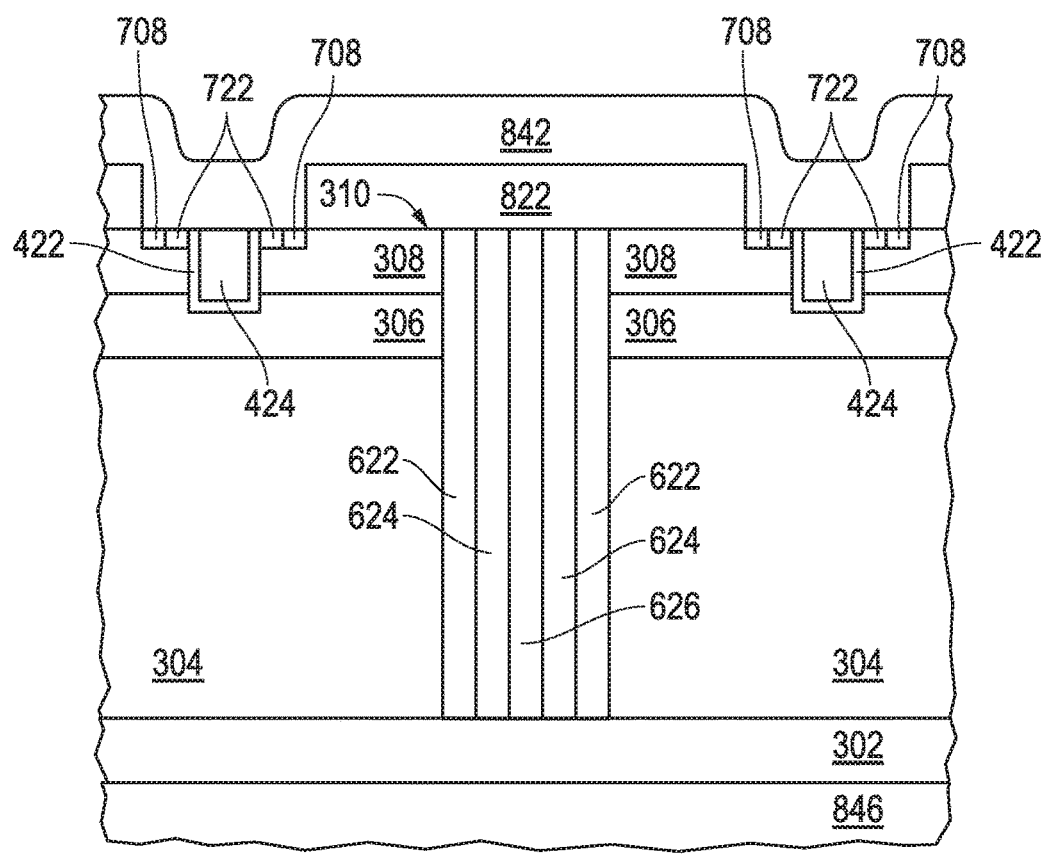
FIG. 8 includes an illustration of the workpiece of FIG. 7 after forming substantially completed transistor structures.

FIG. 8 includes a cross-sectional view of the workpiece after forming substantially completed transistor structures. An interlevel dielectric (ILD) layer 822 is deposited over the primary surface 310. The ILD layer 822 can include an oxide, a nitride, an oxynitride, an organic dielectric, or any combination thereof. The ILD layer 822 can include a single film having a substantially constant or changing composition (e.g., a high phosphorus content further from the primary surface 310) or a plurality of discrete films. An etch-stop film, an antireflective film, or a combination may be used within or over the ILD layer 822 to help with processing. The ILD layer 822 can be deposited to a thickness in a range of approximately 0.5 micron to approximately 2.0 microns. The ILD layer 822 may be planarized to improve process margin during subsequent processing operations (for example, lithography, subsequent polishing, or the like).

The ILD layer 822 is patterned to define contact openings that exposed the body contact regions 708, the source regions 722, the gate electrodes 424, and the compensation layer 624. The openings to the gate electrodes 424 and the compensation layer 622 are not illustrated in FIG. 8. Interconnects, including interconnect 842, are formed that extend into the contact openings within the ILD layer 822. The interconnect 842 contacts the body contact regions 708 and source regions 722. The interconnect 842 also contacts the compensation layer 624 at locations not illustrated in FIG. 8. The interconnect 842 can be part of the source terminal for the electronic device. Another interconnect (not illustrated in FIG. 8) can be formed at the same interconnect level as the interconnect 842 and is electrically connected to the gate electrodes 424. The workpiece can be thinned during a back lapping operation, and metallization 846 can be applied to the backside of the thinned workpiece to form a drain terminal that contacts the buried doped region 302.

Figure 9:
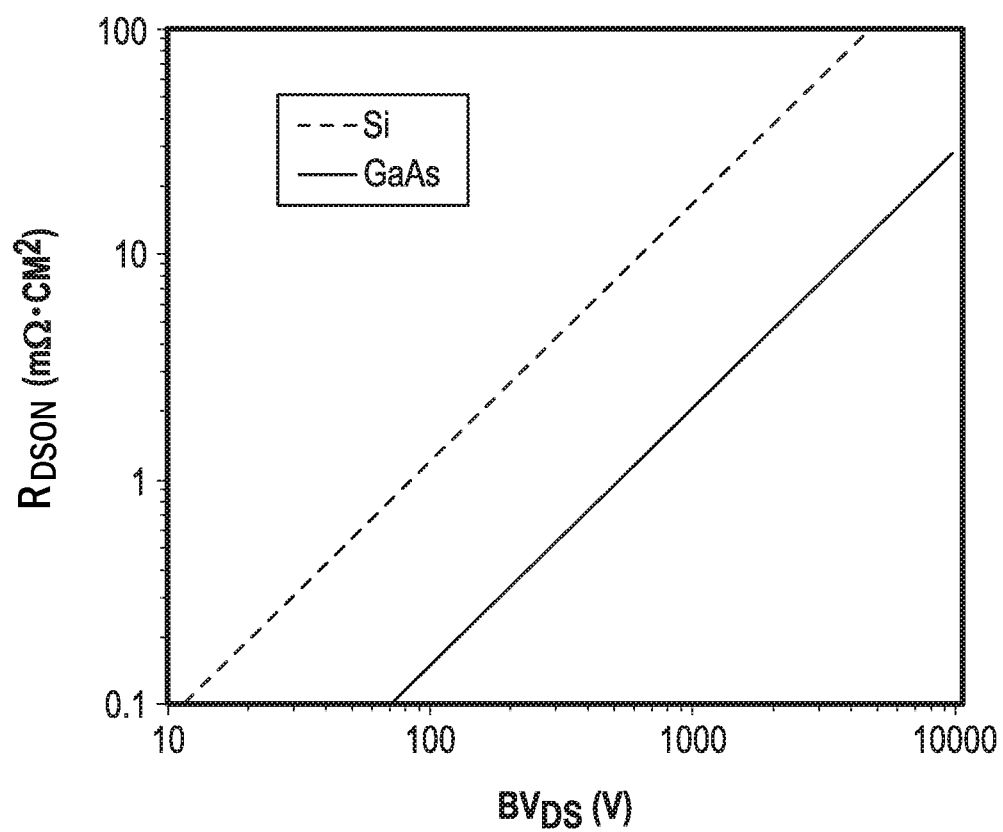
FIG. 9 includes a plot of a simulation of on-state resistance as a function of drain-to-source breakdown voltage for Si and GaAs.

Embodiments as described herein provide transistor structures that have good channel properties and charge carrier mobility that are particularly well suited for high-voltage applications, such at 400 V and higher. A superjunction includes a drift layer and a compensation layer, so that the drift layer is charge balanced and has high carrier mobility. As compared to a similar transistor structure that includes only Si as the semiconductor base material, the transistors structures as described herein can have significantly lower on-state resistance ($R_{DSON}$) as compared to the similar transistor structure (Si is the sole semiconductor base material). FIG. 9 includes a simulation of $R_{DSON}$ versus drain-to-source breakdown voltage ($BV_{DS}$) for transistor structures having the same cell size and same process flow, other that the substitution of materials for the superjunction). $R_{DSON}$ for the Si/GaAs transistor structures is approximately an order of magnitude lower that $R_{DSON}$ for the Si transistor structures at least for any particular $BV_{DS}$ within a range of 70 V to 5000 V.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device can include a transistor structure, the transistor structure including a channel region including a first semiconductor base material; and a drift structure including a second semiconductor base material that is different from the first semiconductor base material.

Embodiment 2

The electronic device of Embodiment 1, wherein the first and second semiconductor base materials have conduction bands that have corresponding energies at 300° K that are within 0.20 eV of each other.

Embodiment 3

The electronic device of Embodiment 1, further including a first semiconductor layer having a first conductivity type, wherein the drift structure includes a second semiconductor layer adjacent to the first semiconductor layer and having a second conductivity type opposite the first conductivity type; and a first product of a first dopant concentration times of a volume of the first semiconductor layer is within 50% of a second product of a second dopant concentration times a volume of the second semiconductor layer.

Embodiment 4

The electronic device of Embodiment 1, wherein the first semiconductor base material is Si, and the second semiconductor base material is GaAs, $Al_xGa_{(1-x)}N$ where $0 \leq x < 1$, $In_xAl_{(1-x)}N$ where $0 \leq x < 1$, $In_xAl_{(1-x-y)}Ga_yN$ where $0 \leq x < 1$ and $0 \leq y < 1$, InP, InSb, or any mixture thereof.

Embodiment 5

An electronic device can include a first transistor structure, the first transistor structure including a source region including a first semiconductor base material and having a first conductivity type; and a drain structure including a first region that includes a second semiconductor base material different from the first semiconductor base material and has the first conductivity type.

Embodiment 6

The electronic device of Embodiment 5, wherein the second semiconductor base material includes a compound semiconductor material.

Embodiment 7

The electronic device of Embodiment 6, wherein the first semiconductor base material is Si.

Embodiment 8

The electronic device of Embodiment 6, wherein the compound semiconductor material is a III-V semiconductor material.

Embodiment 9

The electronic device of Embodiment 5, further including a buried doped region underlying the source region and having the first conductivity type.

Embodiment 10

The electronic device of Embodiment 9, further including a doped region adjacent to the first region of the drain structure, wherein the doped region has the second conductivity type and extends a majority of the distance from a primary surface of the first semiconductor base material to the buried doped region.

Embodiment 11

The electronic device of Embodiment 10, wherein the doped region of the second conductivity type adjacent to the first region of the drain structure includes the first semiconductor base material.

Embodiment 12

The electronic device of Embodiment 10 wherein the doped region of the second conductivity type adjacent to the first region of the drain structure includes the second semiconductor base material.

Embodiment 13

The electronic device of Embodiment 5, wherein the drain structure further includes a second region including the first semiconductor base material and having the first conductivity type.

Embodiment 14

The electronic device of Embodiment 13, further including a body region disposed between the source region and the second region of the drain structure, including the first semiconductor base material, and having a second conductivity type opposite the first conductivity type; and a gate electrode extending through the source region and the body region and only partly, not completely, through the second region of the drain structure.

Embodiment 15

The electronic device of Embodiment 13, wherein the first region of the drain structure has a carrier mobility of greater than 1410 $cm^2/V\sim s$, and the second region of the drain structure has a carrier mobility of at most 1410 $cm^2/V\sim s$.

Embodiment 16

The electronic device of Embodiment 13, further including: a buried doped region including the first semiconductor base material and having the first conductivity type; a semiconductor layer disposed between the buried doped region and the second region of the drain structure, and including the first semiconductor base material; a compensation layer adjacent to the first region of the drain structure, wherein a combination of the compensation layer and the first region are parts of a superjunction; a body region disposed between the source region and the second region of the drain structure, including the first semiconductor base material, and having a second conductivity type opposite the first conductivity type; and a gate electrode extending through the source region and the body region, wherein the first region of the drain structure lies along a sidewall of the semiconductor layer and along a conduction path between the buried doped region and the second region of the drain structure.

Embodiment 17

The electronic device of Embodiment 16, wherein the first semiconductor base material is Si, and the second semiconductor base material is GaAs.

Embodiment 18

A process of forming an electronic device can include: forming a semiconductor layer over a buried doped region having a first conductivity type; forming a body region along a primary surface of the semiconductor layer, wherein the body region includes a first semiconductor base material and has a second conductivity type opposite the first conductivity type; patterning the body region and the semiconductor layer to define a trench extending toward the buried doped region and having a sidewall; and forming a first region of a drain structure along the sidewall of the trench, wherein the first region includes a second semiconductor base material different from the first semiconductor base material and has the first conductivity type, wherein a transistor structure includes the body region and the first region of the drain structure.

Embodiment 19

The process of Embodiment 18, further including: forming a second region of the drain structure, wherein the second region is disposed between the body region and the buried doped region, includes the first semiconductor base material, and has the first conductivity type; patterning the body region and the second region of the drain structure to define an opening extending completely through the body region and only partly, not completely, through the second region of the drain structure; forming a gate electrode within the opening; forming a compensation layer within the trench and adjacent to the first region of the drain structure; and forming a source region adjacent to the body region and the gate electrode, wherein the source region includes the first semiconductor base material and has the first conductivity type.

Embodiment 20

The process of Embodiment 18, wherein the first semiconductor base material is Si, and the second semiconductor base material is GaAs, $Al_xGa_{(1-x)}N$ where $0 \leq x < 1$, $In_xAl_{(1-x)}N$ where $0 \leq x < 1$, $In_xAl_{(1-x-y)}Ga_yN$ where $0 \leq x < 1$ and $0 \leq y < 1$, InP, InSb, or any mixture thereof.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device including a transistor structure, the transistor structure comprising:
    a channel region including a first semiconductor base material and having a first conductivity type; and
    a superjunction structure including a first semiconductor layer that includes a second semiconductor base material that is different from the first semiconductor base material, wherein the first semiconductor layer has the first conductivity type.

2. The electronic device of claim 1, wherein the first and second semiconductor base materials have conduction bands that have corresponding energies at 300° K that are within 0.20 eV of each other.

3. The electronic device of claim 1, wherein:
    the superjunction structure comprises a second semiconductor layer adjacent to the first semiconductor layer,
    the second semiconductor layer includes the second semiconductor base material and has a second conductivity type opposite the first conductivity type,
    the first semiconductor layer has a first dopant concentration and the second semiconductor layer has a second dopant concentration, and
    a first product of the first dopant concentration times of a volume of the first semiconductor layer is within 50% of a second product of the second dopant concentration times a volume of the second semiconductor layer.

4. The electronic device of claim 1, wherein the first semiconductor base material is Si, and the second semiconductor base material is GaAs, $Al_xGa_{(1-x)}N$ where $0 \leq x < 1$, $In_xAl_{(1-x)}N$ where $0 \leq x < 1$, $In_xAl_{(1-x-y)}Ga_yN$ where $0 \leq x < 1$ and $0 \leq y < 1$, InP, InSb, or any mixture thereof.

5. The electronic device of claim 1, wherein the superjunction structure further comprises a second semiconductor layer that includes the second semiconductor base material and has a second conductivity type opposite the first conductivity type.

6. The electronic device of claim 5, further comprising a doped region underlying the channel region, wherein the doped region includes the first semiconductor base material and has the second conductivity type, wherein a drain structure includes the doped region and the second semiconductor layer of the superjunction structure.

7. An electronic device including a first transistor structure, the first transistor structure comprising:
    a buried doped region including a first semiconductor base material and having a first conductivity type; and
    a superjunction structure including a first region that includes a second semiconductor base material different from the first semiconductor base material and has a second conductivity type opposite the first conductivity type.

8. The electronic device of claim 7, wherein the second semiconductor base material includes a compound semiconductor material.

9. The electronic device of claim 8, wherein the first semiconductor base material is Si.

10. The electronic device of claim 8, wherein the compound semiconductor material is a III-V semiconductor material.

11. The electronic device of claim 7, wherein the superjunction structure further comprises a second region along a side of the first region of the superjunction structure, wherein the second region includes the second semiconductor base material and has the first conductivity type.

12. The electronic device of claim 11, further comprising a body region overlying the buried doped region, wherein the body region includes the first semiconductor base material and has the second conductivity type.

13. The electronic device of claim 12, further comprising:
   a doped region disposed between the body region and the buried doped region, including the first semiconductor base material and having the first conductivity type, wherein the second region of the superjunction structure lies along a conduction path between the doped region and the buried doped region; and
   a gate electrode extending through the source region and the body region and only partly, not completely, through the doped region that overlies the buried doped region.

14. The electronic device of claim 13, wherein a drain structure comprises the doped region and the second region of the superjunction structure, wherein the second region has a carrier mobility greater than 1410 cm$^2$/V·s, and the doped region of the drain structure has a carrier mobility of at most 1410 cm$^2$/V·s.

15. The electronic device of claim 12, further comprising:
   a semiconductor layer disposed between the buried doped region and the doped region overlying the buried doped region, and including the first semiconductor base material;
   a doped region disposed between the semiconductor layer and the body region, including the first semiconductor base material, and having the first conductivity type; and
   a source region overlying a channel region of the transistor, including the first semiconductor base material, and having the second conductivity type; and
   a gate electrode extending through the source region and the body region,
   wherein the second region of the superjunction structure lies along a sidewall of the semiconductor layer and along a conduction path between the buried doped region and the doped region disposed between the semiconductor layer and the body region.

16. The electronic device of claim 15, wherein the first semiconductor base material is Si, and the second semiconductor base material is GaAs.

17. The electronic device of claim 15, further comprising a semiconductor layer, wherein a trench extends through at least a majority of a thickness of the semiconductor layer, and the second region of superjunction structure lies along a sidewall of the trench.

18. An electronic device including a first transistor structure, the first transistor structure comprising:
   a source region including a first semiconductor base material and having a first conductivity type;
   a drain structure including:
      a first region that includes the first semiconductor base material and has the first conductivity type; and
      a second region that includes a second semiconductor base material different from the first semiconductor base material and has the first conductivity type; and
   a buried doped region contacting the second region of the drain structure and having the first conductivity type.

19. The electronic device of claim 18, comprising a superjunction structure including the second region of the drain structure and another region, wherein the other region is along the second region, includes the second semiconductor base material, and has a second conductivity type opposite the first conductivity type.

20. The electronic device of claim 18, further comprising a body region overlying the first region of the drain structure, wherein the body region includes the first semiconductor base material and has a second conductivity type opposite the first conductivity type.

* * * * *